United States Patent [19]
Rahilly

[11] 3,985,579
[45] Oct. 12, 1976

[54] RIB AND CHANNEL VERTICAL MULTIJUNCTION SOLAR CELL
[75] Inventor: William P. Rahilly, Dayton, Ohio
[73] Assignee: The United States of America as represented by the Secretary of the Air Force, Washington, D.C.
[22] Filed: Nov. 26, 1975
[21] Appl. No.: 635,464

[52] U.S. Cl. .................................... 136/89; 29/572
[51] Int. Cl.² ....................................... H01L 31/04
[58] Field of Search ................................... 136/89

[56] References Cited
UNITED STATES PATENTS

| | | | |
|---|---|---|---|
| 3,104,188 | 9/1963 | Moncrieff-Yeates | 136/89 |
| 3,422,527 | 1/1969 | Gault | 29/572 |
| 3,653,971 | 4/1972 | Lidorenko et al. | 136/89 |
| 3,690,953 | 9/1972 | Wise | 136/89 |
| 3,936,319 | 2/1976 | Anthony | 136/89 |
| 3,948,682 | 4/1976 | Bordina et al. | 136/89 |

OTHER PUBLICATIONS
B. L. Sater et al., "The Multiple Junction Edge Illuminated Solar Cell", 10th IEEE Photovoltaic Specialists Conference, Palo Alto, Calif, Nov. 1973.

W. P. Rahilly, "Vertical Multijunction Solar Cells", 9th IEEE Photovoltaic Specialists Conference, Silver Spring, Md., May, 1972.

H. J. Hovel "Semiconductors & Semimetals — vol. 11 Solar Cells," Academic Press, N.Y. (1975), pp. 139–145.

Primary Examiner—John H. Mack
Assistant Examiner—Aaron Weisstuch
Attorney, Agent, or Firm—Joseph E. Rusz; Robert Kern Duncan

[57] ABSTRACT

A vertical multijunction solar cell fabricated with the junction channels perpendicular to a ribbed electrical grid structure provides an improved vertical multijunction solar cell having increased mechanical strength and decreased electrical resistance.

2 Claims, 7 Drawing Figures

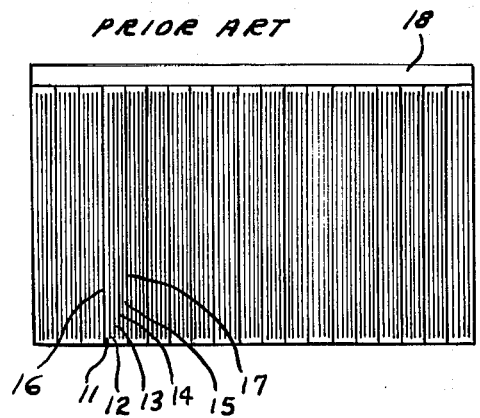
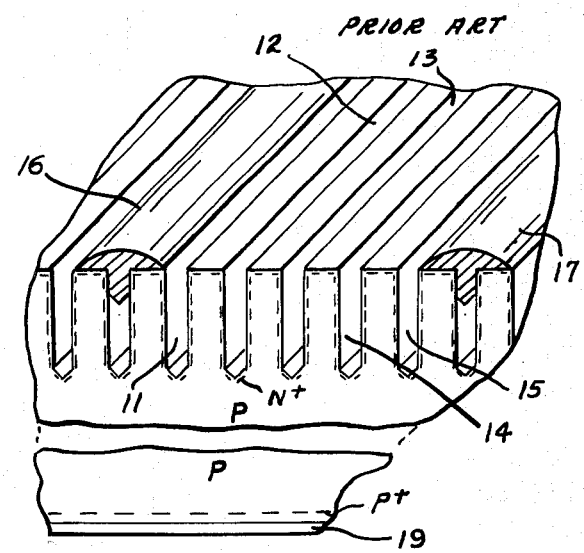
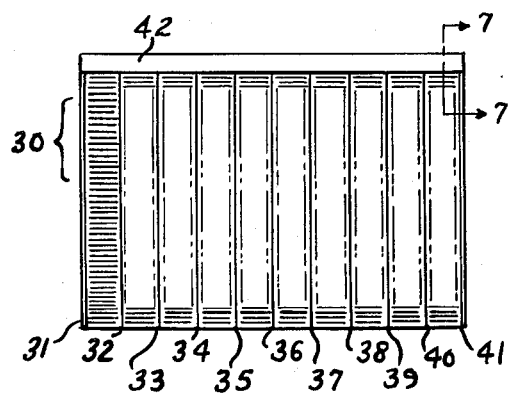
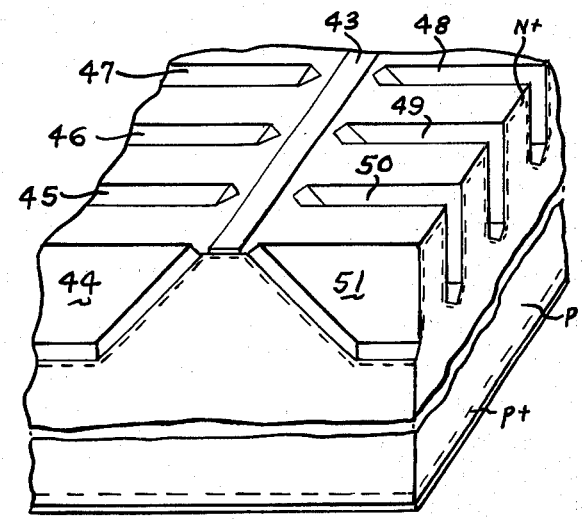
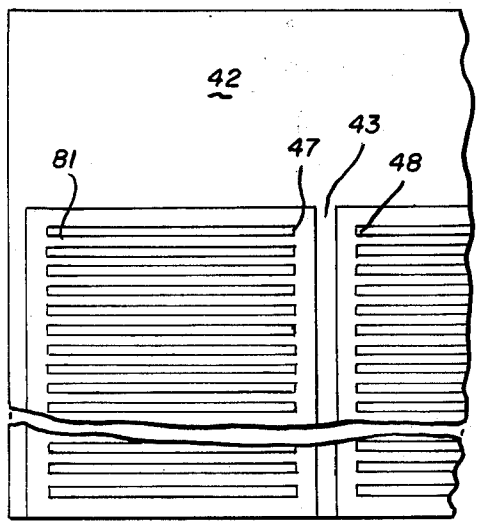

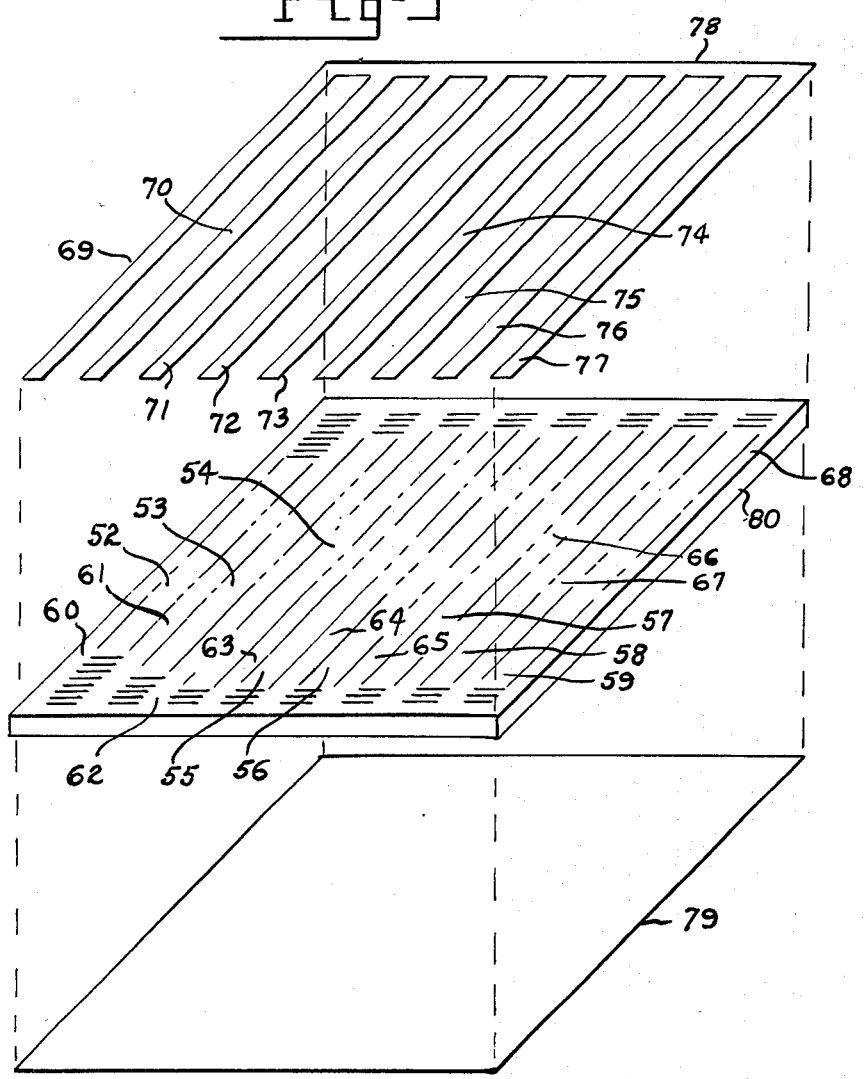
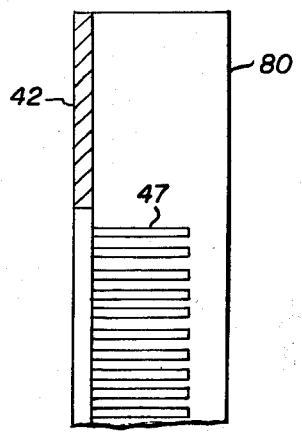

RIB AND CHANNEL VERTICAL MULTIJUNCTION SOLAR CELL

RIGHTS OF THE GOVERNMENT

The invention described herein may be manufactured and used by or for the government of the United States for all governmental purposes without the payment of any royalty.

BACKGROUND OF THE INVENTION

The field of the invention is in the art of solar cells and particularly vertical multijunction solar cells.

Vertical multijunction solar cells are well known. Their enhanced radiation resistance is well recognized, however, the present state of the art cells generally have a poor conversion efficiency because of an inherently high series resistance factor associated with their structural configuration. This results from a relatively long path length that the charges have to travel in order to reach a grid finger. In addition the present state of the art structures have a mechanical fragility resulting from a tendency of these cells to fracture along any one of the channels when structural stresses are applied to the cell, as when handling and mounting the cell as well as from shocks, vibration, and structural stresses encountered by the cells during launch and in transportation.

Typical examples of the prior art are exemplified by U.S. Pat. No. 3,690,953 to patentee J. F. Wise, and the following published papers: W. P. Rahilly, "Vertical Multijunction Solar Cells," Conf. Record of the Ninth IEEE Photovoltaic Specialists Conference, May 1972, page 44; P. Stella and A. Gover, "Vertical Multijunction Solar Cell," Conf. Record of the Ninth IEEE Photovoltaic Specialists Conference, May 1972, page 85; and R. K. Smeltzer, D. L. Kendall, and G. L. Varnell, "Vertical Multijunction Solar Cell Fabrication," Conf. Record of the Tenth IEEE Photovoltaic Specialists Conf., November 1973, page 194.

SUMMARY OF THE INVENTION

An improved vertical multijunction solar cell having higher conversion efficiency and greater mechanical strength is provided by a rib and channel construction in which the channels comprising the vertical junctions are fabricated perpendicular to the ribs bearing the electrical conductor grid. This increase in conversion efficiency is due to a reduction in the series resistance of the cell. The term "fill factor" is commonly used as an expression of cell efficiency. The fill factor value is determined from the current-voltage characteristics and is mathematically stated as:

$$\text{fill factor} = \frac{\text{current at maximum power} \times \text{voltage at maximum power}}{\text{short circuit current} \times \text{open circuit voltage}}$$

(To express as a percentage, multiply this value by 100.) Fill factor values for typical prior art devices are generally 0.65 or less while for embodiments of the invention as described herein typical values of fill factor are 0.76 and higher.

BRIEF DESCRIPTION OF THE DRAWING

FIG. 1 is a schematic-pictorial plan view of a typical prior art vertical multijunction solar cell;

FIG. 2 is a schematic representation in elevation of a small section of a typical prior art vertical multijunction solar cell;

FIG. 3 is a schematic-pictorial representation of a plan view of an embodiment of the invention;

FIG. 4 is an enlarged schematic sectional elevation view of the embodiment of FIG. 3 showing a section of six channels and a part of a rib and electrical contact finger;

FIG. 5 schematically represents the positioning of the electrical contact electrodes on the rib and channel cell substrate;

FIG. 6 is an enlarged schematic view of the upper left and lower left corners of the cell shown in FIG. 3; and FIG. 7 is a representative schematic view through a portion of the upper right hand corner of the cell shown in FIG. 3.

DESCRIPTION OF THE PREFERRED EMBODIMENT

As previously mentioned, vertical multijunction solar cell of prior art construction are fragile and have a poor conversion efficiency. Typical prior art cell construction is shown in FIGS. 1 and 2. The vertical junctions are formed on the sides and bottoms of the channels such as channels 11, 12, 13, 14, and 15, located between the electrical contact strips 16 and 17. The particular cell depicted in FIGS. 1 and 2 has eighteen of these contact strips joining in the header strip 18 to which electrical contact to the cell is made. The other electrical contact to the cell is made to the metallized coating 19 covering the bottom of the cell. The particular cell illustrated is an N/P type cell.

An improved cell construction is shown by the embodiment depicted by FIGS. 3 through 7. In this novel structure the channels forming the vertical junctions are relatively short and instead of running substantially the full width of the cell parallel to the electrical contact fingers, as shown in the prior art in FIGS. 1 and 2, they are formed in a direction along the length of the cell as shown in FIG. 3. (While a length and width is referred to, it is to be understood that the cells may be constructed in any shape such as square or even substantially round.) Thus, the relatively short channels 30 are separated by ribs 31 through 41 running the width of the cell and perpendicular to the channels. These ribs add great physical strength to the cell and greatly reduce cell breakage and fracturing. The ribs also support electrical contact strips which run along the length of the ribs and join in the electrical header 42. FIG. 4 is an enlarged vertical schematic view showing a typical electrical contact strip 43 with sections of eight perpendicularly abutting channels 44 through 51.

FIG. 5 is an exploded type of view showing the substrate 80 with the strips 52 through 59 of formed channels positioned perpendicular to and separated by the ribs 60 through 68. Electrical contact fingers 69 through 77, terminating in the header 78, are positioned on these ribs, and a lower contacting surface 79 is positioned over the bottom of the cell. (These electrical contacts are conventionally deposited metallization contacts and normally not sheets as might be inferred from the Figure.)

The materials, methods, and processes of forming these improved solar cells are conventional and well known techniques and materials. To further aid in understanding the complete invention a brief example of typical fabrication materials and techniques will be set forth for forming an N/P type cell. Substantially the well known steps comprise:

1. Form oxide over entire P-type silicon slice with (110) orientation.
2. Photolithographically produce opened lines in the photo resist. The opened lines are accurately aligned parallel to the (111) planes in the silicon.
3. Remove oxide in the opened areas.
4. Remove the remaining photo resist and orientation dependent etch in KOH.H$_2$O to desired channel depth.
5. Remove rest of oxide on etched side of slice and planar etch.
6. Diffuse with arsenic or phosphorus to form P/N junction.
7. Remove back oxide and ion implant aluminum into back surface to form P+ region.
8. Anneal ion implant.
9. Deposit back contact metallization (silver).
10. Deglaze top surface.
11. Evaporate top contacts through grid pattern and sinter top and bottom contacts.
12. Apply suitable anti-reflective coating (such as TiOx, SiO, Ta$_2$O$_5$, etc.)

To further describe a typical embodiment, FIG. 6 is presented showing an enlarged view of the upper and lower corners of the device represented in FIG. 3, and FIG. 7 illustrates a small vertical section through the cell. A typical cell has an overall size of approximately 2 cm by 2 cm, the header 42 is approximately 0.04 cm wide, and the electrical contact fingers, such as 43, are approximately 0.004 cm wide and 0.001 cm thick. The contact fingers (62 etc.) are deposited on the ribs located between the ends of the channels such as 47 and 48. The ribs are approximately 0.006 cm wide. Typical channel lengths, (such as channel 47) are approximately 0.1 cm with a width of approximately 0.0005 cm. The depth of the channels in the substrate, such as channel 80 in FIG. 7, is approximately 0.005 cm and the total thickness of the substrate 80 is approximately 0.03 cm. The spacing 81 between the channels is approximately 0.0015 cm. It is to be understood that these specific values are set forth by way of example only to aid in comprehending the general structure of the invention and are not to be considered as limiting the scope of the invention.

I claim:

1. A vertical multijunction solar cell having a plurality of channels providing vertical junctions formed in the upper surface of a semiconductor substrate, a conducting surface on the bottom of said substrate providing an electrical contact and a header on the upper surface of said substrate for providing electrical contact with the cell, the improvement wherein:
    a. said channels in said substrate are parallel to said header and are formed in strips perpendicular to said header with ribs formed of said semiconductor substrate between adjacent strips; and
    b. electrical contact fingers are disposed on said ribs and in electrical contact with said header.

2. A rib and channel vertical junction solar cell comprising:
    a. a semiconductor substrate having an upper surface and a lower surface;
    b. a plurality of adjacent parallel channels of vertical photovoltaic junctions extending into said semiconductor substrate from said upper surface providing strips of channels, each having a rib of substrate material, said ribs being at each end perpendicular to each of said channels;
    c. an electrical conducting finger positioned on each rib;
    d. an electrical header positioned on the said upper surface of the substrate in electrical contact with each finger and providing a first electrical contact to the said cell; and
    e. an electrical conductor positioned on the said lower surface providing a second electrical contact to the said cell.

* * * * *

UNITED STATES PATENT OFFICE
CERTIFICATE OF CORRECTION

PATENT NO. : 3,985,579
DATED : October 12, 1976
INVENTOR(S) : William P. Rahilly It is certified that error appears in the above—identified patent and that said Letters Patent are hereby corrected as shown below:

Col. 4, line 29, after "material" insert -- at each end --; Same line, after "being" delete -- at each end --.

Signed and Sealed this

Fifteenth Day of February 1977

[SEAL]

Attest:

RUTH C. MASON
*Attesting Officer*

C. MARSHALL DANN
*Commissioner of Patents and Trademarks*